United States Patent
Yoo et al.

(10) Patent No.: US 8,525,150 B2
(45) Date of Patent: Sep. 3, 2013

(54) SEMICONDUCTOR LIGHT EMISSION DEVICE FOR PREVENTING A REGIONAL CONCENTRATION PHENOMENON OF A CURRENT FLOW AND IMPROVING THE RELIABILITY

(75) Inventors: Min Ki Yoo, Gumi-si (KR); Koo Hwa Lee, Gyeongbuk (KR); Rok Hee Lee, Gyeongbuk (KR); Geun Woo Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 342 days.

(21) Appl. No.: 12/908,198

(22) Filed: Oct. 20, 2010

(65) Prior Publication Data
US 2011/0095262 A1 Apr. 28, 2011

(30) Foreign Application Priority Data
Oct. 22, 2009 (KR) ........................ 10-2009-0100922

(51) Int. Cl.
*H01L 29/06* (2006.01)
*H01L 31/00* (2006.01)

(52) U.S. Cl.
USPC ............... 257/13; 257/79; 257/81; 257/99; 257/103; 257/640; 438/39; 438/42; 438/47

(58) Field of Classification Search
USPC ................ 257/79, 80, 81, 99, 13, E33.034, 257/21, 22, 82, 84, 86, 94, 96, 98, 101, 102, 103, 431, 618, 461, 918, 85, 640; 438/FOR. 453, 22, 28, 29, 39, 42, 46, 47, 479, 483
See application file for complete search history.

(56) References Cited

U.S. PATENT DOCUMENTS

| | | | |
|---|---|---|---|
| 6,015,979 A * | 1/2000 | Sugiura et al. | 257/86 |
| 2004/0115847 A1 * | 6/2004 | Hasegawa et al. | 438/22 |

* cited by examiner

*Primary Examiner* — Thanh Y Tran
(74) *Attorney, Agent, or Firm* — McKenna Long & Aldridge LLP

(57) ABSTRACT

A semiconductor light emission device is disclosed. The semiconductor light emission device includes: a substrate; a current concentration preventing pattern formed in a mesh net shape on the substrate; an n-type clad layer formed on the substrate loaded with the current concentration preventing pattern; an active layer and a p-type clad layer sequentially formed on the n-type clad layer; an n-type electrode formed on a part of the n-type clad layer which is exposed by partially etching the p-type clad layer and active layer; and a p-type electrode formed on the p-type clad layer. The current concentration preventing pattern is formed in a double layer structure which includes a first layer formed from one material of SiO and SiN and on the substrate, and a second layer formed from a metal material and on the first layer.

10 Claims, 2 Drawing Sheets

SEMICONDUCTOR LIGHT EMISSION DEVICE FOR PREVENTING A REGIONAL CONCENTRATION PHENOMENON OF A CURRENT FLOW AND IMPROVING THE RELIABILITY

CROSS-REFERENCE TO RELATED APPLICATION

This application claims priority under 35 U.S.C. 119 to Korean Patent Application No. 10-2009-0100922, filed on Oct. 22, 2009, which is hereby incorporated by reference in its entirety.

BACKGROUND

1. Field of the Disclosure

This disclosure relates to a semiconductor light emission device, and more particularly to a semiconductor light emission device adapted to improve reliability through a uniform current flow.

2. Description of the Related Art

In general, light emission diodes (LEDs) have a basic structure which includes n-type semiconductor layer, a light emission layer, and a p-type semiconductor layer sequentially epitaxied on a crystal substrate. The light emission layer can be formed in one of double hetero (DH), single quantum well (SQW), and multi quantum well (MQW) structures. Any one of a Sic substrate, a GaN substrate, a sapphire substrate, and others can be used as a crystal substrate. The n-type semiconductor layer, the crystal substrate, and the p-type semiconductor layer are formed to include outlet electrodes, respectively.

FIG. 1 is a cross-sectional view schematically showing the structure of a semiconductor light emission device according to the related art. Referring to FIG. 1, the semiconductor light emission device structurally includes a sapphire substrate 1 suitable to transmit light, a buffer layer 10 formed on the sapphire substrate 1, and a sequentially stacked layer of an n-type clad layer 20, an active layer 30 and a p-type clad layer 40 which is formed on the buffer layer 10.

The active layer has a MQW structure containing InGaN. The n-type clad layer 20, the active layer 30, and the p-type clad layer 40 are sequentially formed by performing an epitaxial growth process. The p-type clad layer 40 and the active layer 30 is partially removed from the n-type clad layer 20 by performing a mesa etching process, so as to expose a part of the upper surface of the n-type clad layer 20.

The light emission device further includes an n-type electrode formed on the partially exposed upper surface of the n-type clad layer 20, and a transparent conductor layer 50 and a p-type electrode 60 sequentially stacked on the p-type clad layer 40. The transparent conductor layer 50 is formed from indium-tin-oxide (ITO) or others.

In this manner, the semiconductor light emission device uses the sapphire substrate 1 with the light transmitting property as a nonconductor substrate. The p-type and n-type electrodes 60 and 70 are formed on upper surfaces of the epitaxially grown layers, respectively, while the semiconductor light emission device with the sapphire substrate 1 is manufactured.

Such a semiconductor light emission device causes a current flowing between the p-type and n-type electrodes 60 and 70 to be excessively concentrated to the etched surfaces of the p-type clad layer 40 and the active layer 30. This regionally excessive concentration phenomenon of the current flow deteriorates the reliability of the semiconductor light emission device using the sapphire substrate 1.

BRIEF SUMMARY

Accordingly, the present embodiments are directed to a semiconductor light emission device and manufacturing method of the same that substantially obviates one or more of problems due to the limitations and disadvantages of the related art.

An object of the present disclosure is to provide a semiconductor light emission device and method of manufacturing the same that is adapted to prevent the regional concentration phenomenon of a current flow and to improve the reliability.

Another object of the present disclosure is to provide a semiconductor light emission device with a structure which includes a current concentration preventing pattern formed in a double layer of a SiO or SiN layer and a metal layer on an n-type clad layer and electrically connected to the n-type clad layer.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to one general aspect of the present embodiment, a semiconductor light emission device includes: a substrate; a current concentration preventing pattern formed in a mesh net shape on the substrate; an n-type clad layer formed on the substrate loaded with the current concentration preventing pattern; an active layer and a p-type clad layer sequentially formed on the n-type clad layer; an n-type electrode formed on a part of the n-type clad layer which is exposed by partially etching the p-type clad layer and active layer; and a p-type electrode formed on the p-type clad layer. The current concentration preventing pattern is formed in a double layer structure which includes a first layer formed from one material of SiO and SiN and on the substrate, and a second layer formed from a metal material and on the first layer.

A semiconductor light emission device according to another aspect of the present embodiment includes: a substrate; a first n-type clad layer formed on the substrate; a current concentration preventing pattern formed in a mesh net shape and on the first n-type clad layer; a second n-type clad layer formed on the first n-type clad layer loaded with the current concentration preventing pattern; an active layer and a p-type clad layer sequentially formed on the second n-type clad layer; an n-type electrode formed on a part of the first n-type clad layer which is exposed by partially etching the p-type clad layer, active layer, and second n-type clad layer; and a p-type electrode formed on the p-type clad layer. The current concentration preventing pattern is formed in a double layer structure which includes a first layer formed from one material of SiO and SiN and on the substrate, and a second layer formed from a metal material and on the first layer.

According to one general aspect of the present invention, a manufacturing method of a semiconductor light emission device includes: providing a sapphire substrate covered with a buffer layer; primarily growing a silicon oxide (SiO) or silicon nitride (SiN) layer on the sapphire substrate, and then by growing a metal layer on the silicon oxide of silicon nitride layer; forming a current concentration preventing pattern with a mesh net shape; sequentially forming a n-type clad layer, an active layer and a p-type clad layer on an entire surface of the sapphire substrate with the current concentration pattern; forming a transparent conductor on the p-type layer; partially removing the transparent conductor, p-type clad layer and active layer to expose parts of the n-type clad layer and the current concentration preventing pattern by performing a mesa etching process; and etching a part of the n-type clad layer by a fixed thickness in order to expose a part of the current concentration preventing pattern, wherein a p-type electrode is formed on the transparent conductor layer, and a n-type electrode is formed on the exposed parts of the n-type clad layer and current concentration preventing pattern.

A manufacturing method of a semiconductor light emission device includes: providing a sapphire substrate covered with a buffer layer; forming a first n-type clad layer on the buffer layer; primarily growing a silicon oxide (SiO) or silicon nitride (SiN) layer on an entire surface of the first n-type clad layer, and then by growing a metal layer on the silicon oxide of silicon nitride layer; forming a current concentration preventing pattern with a mesh net shape; sequentially forming a second n-type clad layer, an active layer and a p-type clad layer on an entire surface of the sapphire substrate with the current concentration pattern; forming a transparent conductor on the p-type layer; partially removing the transparent conductor, p-type clad layer and active layer to expose parts of the second n-type clad layer and the current concentration preventing pattern by performing a mesa etching process; and etching a part of the second n-type clad layer by a fixed thickness in order to expose a part of the current concentration preventing pattern, wherein a p-type electrode is formed on the transparent conductor layer, and a n-type electrode is formed on the exposed parts of the second n-type clad layer and current concentration preventing pattern.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings.

DETAILED DESCRIPTION

Figure 1:
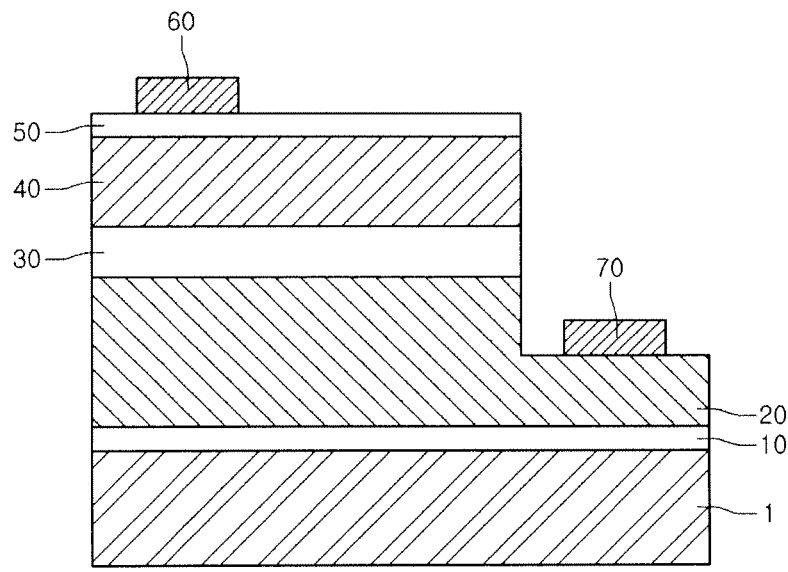
FIG. 1 is a cross-sectional view schematically showing the structure of a semiconductor light emission device according to the related art.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

Furthermore, it will be understood that when an element, such as a substrate, a layer, a region, a film, or an electrode, is referred to as being formed "on" or "under" another element in the embodiments, it may be directly on or under the other element, or intervening elements (indirectly) may be present. The term "on" or "under" of an element will be determined based on the drawings. In the drawings, the sides of elements can be exaggerated for clarity, but they do not mean the practical sizes of elements.

Figure 2:
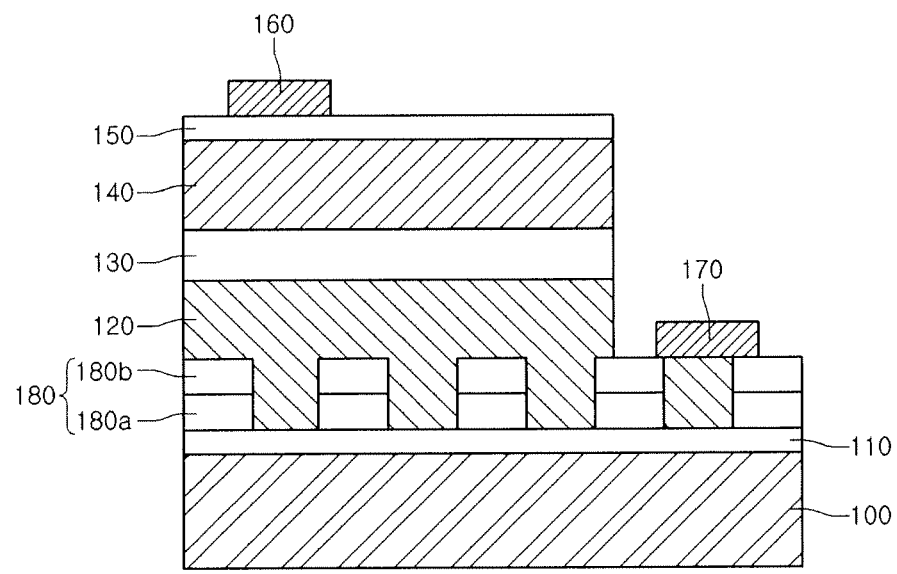
FIG. 2 is a cross-sectional view showing a semiconductor light emission device according to a first embodiment of the present disclosure.

FIG. 2 is a cross-sectional view showing a semiconductor light emission device according to a first embodiment of the present disclosure. Referring to FIG. 2, the semiconductor light emission device includes a substrate 100 suitable to transmit light, a buffer layer 110 formed on the substrate 100, and a current concentration preventing pattern 180 formed on the buffer layer 110. The semiconductor light emission device further includes an n-type clad layer 120 formed on the current concentration preventing pattern 180, an active layer 130 formed on the n-type clad layer 120 and in a MQW structure which include InGaN, and a p-type clad layer 140 formed on the active layer 130. The p-type clad layer 140 and the active layer 130 is partially removed from the n-type clad layer 120 by a mesa etching process, thereby exposing a part the upper surface of the n-type clad layer 120.

The semiconductor light emission device still further includes a transparent conductor layer 150 and a p-type electrode 160 sequentially stacked on the p-type clad layer 140, and an n-type electrode 170 formed on the exposed upper surface of the n-type clad layer 120. The transparent conductor layer 150 can be formed from ITO or others.

The substrate 100 is formed from a material suitable to epitaxially grow a mono crystal. For example, a hybrid material substrate, such as a sapphire substrate, a silicon carbide (SiC) substrate, or others, and a homogeneous material substrate such as a nitride substrate or others can be used as a substrate for the semiconductor light emission device. Preferably, the sapphire substrate is used as a substrate for the semiconductor light emission device.

The buffer layer 110 is used to improve a lattice match between the n-type clad layer 120 and the substrate 100. To this end, the buffer layer 110 is formed on the substrate 100 before the formation of the n-type clad layer 120. Such a buffer layer 110 can be formed from one of AlN and GaN.

The n-type clad layer 120 can be formed from one of GaN and AlGaN which are doped with an n-type conductivity impurity. For example, one of Si, Ge, Sn, or others can be used as an n-type conductivity impurity. It is preferable for the n-type conductivity impurity to use Si. Similarly, the p-type clad layer 140 can be formed one of GaN and AlGaN which are doped with a p-type conductivity impurity. Actually, one of Mg, W, Zn, Be, or others can be used as a p-type conductivity impurity. Preferably, Mg is used as the p-type conductivity impurity.

The active layer 130 is configured to include one of an InGaN layer and a GaN layer which are formed in the MQW structure. The MQW structure is formed to include a plurality of mini-bands. As such, the MQW structure can emit light by a small current and can have superior energy efficiency. Therefore, the MQW structure can provide the semiconductor light emission device with a higher light-emitting output and better electric properties in comparison with a SQW structure.

The p-type clad layer 140 and active layer 130 included in the semiconductor light emission device of the first embodiment are partially etched to expose a part of the upper surface of the n-type clad layer 120 and a part of the current concentration preventing pattern 180. At the same time, a part of the n-type clad layer 120 is etched until a part of the current concentration preventing pattern 18 is exposed. In accordance therewith, the n-type electrode 170 is formed on the exposed part of the current concentration preventing pattern 180 and the exposed upper surface part of the n-type clad layer 120 between the exposed part of the current concentration preventing pattern 180. On the other hand, the p-type electrode 160 formed on the transparent conductor layer 150 functions as a reflecting and bonding metal.

The transparent conductor layer 150 is used for improving a current diffusing effect of the semiconductor light emission device. To this end, the transparent conductor layer 150 enables a current injection area of the semiconductor light emission device to expand. Such a transparent conductor layer 150 is preferably formed from one material selected from a group including ITO, TO (tin oxide), IZO (indium zinc oxide), ITZO (indium tin zinc oxide), TCO (transparent conductive oxide), and so on.

The current concentration preventing pattern 180 is formed in a double layer structure. The double layer includes a silicon oxide (SiO) or silicon nitride (SiN) layer 180a formed on the sapphire substrate 100 covered with the buffer layer 110, and a metal layer 180b stacked on the silicon oxide or silicon nitride layer 180a. The exposed part of the current concentration preventing pattern 180 is electrically connected to the n-type electrode 170 which is disposed on the exposed part of the n-type clad layer 120.

Figure 3:
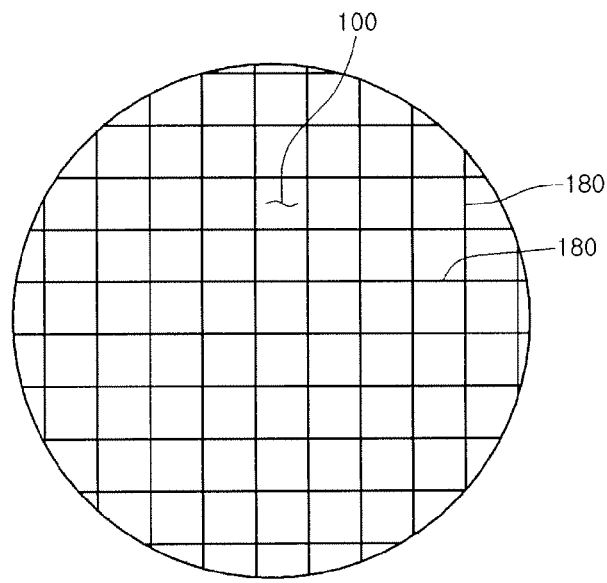
FIG. 3 is a planar view showing a non-uniformly concentrated current prevention pattern formed on the substrate in FIG. 2.

The current concentration preventing pattern 180 is formed in a mesh net, as shown in FIG. 3. More specifically, the current concentration preventing pattern 180 is formed by primarily growing the silicon oxide (SiO) or silicon nitride (SiN) layer 180a on the buffer layer 110 in the mesh net shape and then secondarily growing the metal layer 180b on the silicon oxide (SiO) or silicon nitride (SiN) layer 180a. The silicon oxide (SiO) or silicon nitride (SiN) layer 180a and the metal layer 180b are electrically connected to each other.

In this manner, the current concentration preventing pattern 180 is formed in the mesh net shape on the sapphire substrate 100 covered with the buffer layer 110. As such, the current concentration preventing pattern 180 can be electrically connected to the n-type electrode which is disposed on the exposed part of the n-type clad layer 120 between the part of the current concentration preventing pattern 180.

In order to manufacture the semiconductor light emission device, the current concentration preventing pattern 180 is formed in the mesh net shape by primarily growing the silicon oxide (SiO) or silicon nitride (SiN) layer 180a on the sapphire substrate 100 covered with the buffer layer 110, and then by growing the metal layer 180b on the Sio or SiN layer 180a.

Thereafter, the n-type clad layer 120, the active layer 130, and the p-type clad layer 140 are sequentially formed on the entire surface of the sapphire substrate 100 provided with the current concentration pattern 180, through an epitaxial growth process. Also, the transparent conductor layer 150 is formed on the p-type clad layer 140. The transparent conductor layer 150, p-type clad layer 140 and active layer 130 are partially removed to expose parts of the n-type clad layer 120 and current concentration preventing pattern 180, by performing a mesa etching process. At the same time, a part of the n-type clad layer 180 is etched by a fixed thickness, in order to expose a part of the current concentration preventing pattern 180. Finally, the p-type electrode 160 is formed on the transparent conductor layer 150, and the n-type electrode 170 is simultaneously formed on the exposed parts of the n-type clad layer 120 and current concentration preventing pattern 180.

Similarly, the semiconductor light emission device of the related art using the sapphire substrate 1 forces not only the p-type and n-type electrodes 60 and 70 to be formed on the epitaxially grown surfaces but also the p-type clad layer 140 and active layer 130 to be partially etched, during its manufacturing process. Nevertheless, the semiconductor light emission device causes a regionally excessive concentration phenomenon that a current is excessively concentrated to the etched surfaces of the p-type clad layer 40 and active layer 30 which exposes the part of the upper surface of the n-type clad layer 20.

In a different manner, the semiconductor light emission device according to the first embodiment of the present disclosure allows the current concentration preventing pattern 180 electrically connected to the n-type electrode 170 to be formed on the sapphire substrate 100. As such, the current flow excessively concentrated to the exposed surfaces of the p-type clad layer 140, active layer 130, and n-type clad layer 120 is uniformly dispersed over the entire area of the current concentration preventing pattern 180. Therefore, the semiconductor light emission device configured to use the sapphire substrate 100 can prevent the regionally excessive concentration of a current flow, and furthermore improve the reliability.

Figure 4:
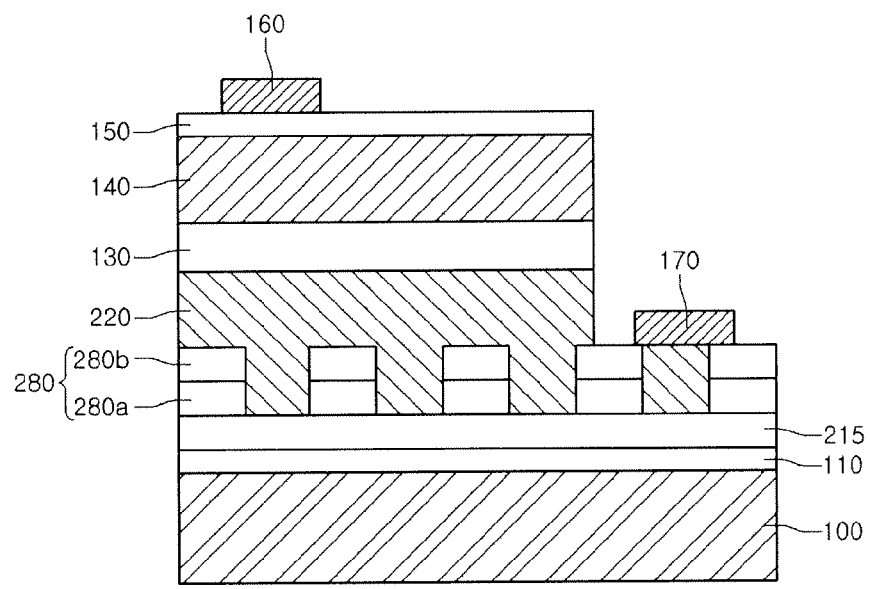
FIG. 4 is a cross-sectional view showing a semiconductor light emission device according to a second embodiment of the present disclosure.

FIG. 4 is a cross-sectional view showing a semiconductor light emission device according to a second embodiment of the present disclosure. As shown in FIG. 4, the semiconductor light emission device of the second embodiment includes a substrate 100 suitable to transmit light, a buffer layer 110 formed on the substrate 100, a first n-type clad layer 215 formed on the buffer layer 110, and a current concentration preventing pattern 280 formed on the first n-type clad layer 215. The semiconductor light emission device further includes a second n-type clad layer 220 formed on the first n-type clad layer 215 loaded with the current concentration preventing pattern 280, an active layer 130 formed on the second n-type clad layer 220 and in a MQW structure which include InGaN, and a p-type clad layer 140 formed on the active layer 130. The semiconductor light emission device still further includes a transparent conductor layer 150 and a p-type electrode 160 sequentially stacked on the p-type clad layer 140, and an n-type electrode 170 formed on the partially exposed upper surface of the second n-type clad layer 220. The transparent conductor layer 150 can be formed from ITO or others.

The p-type clad layer 140 and the active layer 130 is partially removed from the second n-type clad layer 220 by performing a mesa etching process. At the same time, the second n-type clad layer 220 is etched by a fixed thickness. As such, a part the upper surface of the second n-type clad layer 220 is exposed.

The substrate 100 is formed from a material suitable to epitaxially grow a mono crystal. For example, a hybrid material substrate, such as a sapphire substrate, a silicon carbide (SiC) substrate, or others, and a homogeneous material substrate such as a nitride substrate or others can be used as a substrate for the semiconductor light emission device. Preferably, the sapphire substrate is used as a substrate 100 for the semiconductor light emission device of the second embodiment.

The buffer layer 110 is used to improve a lattice match between the first n-type clad layer 215 and the substrate 100. To this end, the buffer layer 110 is formed on the substrate 100 before the formation of the first n-type clad layer 215. Such a buffer layer 110 can be formed from one of AlN and GaN.

The first and second n-type clad layers 215 and 220 can be formed from one of GaN and AlGaN which are doped with an n-type conductivity impurity. For example, one of Si, Ge, Sn, or others can be used as an n-type conductivity impurity. It is preferable for the n-type conductivity impurity to use Si.

Similarly, the p-type clad layer 140 can be formed one of GaN and AlGaN which are doped with a p-type conductivity impurity. Actually, one of Mg, W, Zn, Be, or others can be used as a p-type conductivity impurity. Preferably, Mg is used as the p-type conductivity impurity.

The active layer 130 can be formed from one material of InGaN and GaN. Also, the active layer 130 can be formed in the MQW structure.

The transparent conductor layer 150 is used for improving a current diffusing effect of the semiconductor light emission device. To this end, the transparent conductor layer 150 enables a current injection area of the semiconductor light emission device to expand. Such a transparent conductor layer 150 is preferably formed from one material selected from a group including ITO, TO (tin oxide), IZO (indium zinc oxide), ITZO (indium tin zinc oxide), TCO (transparent conductive oxide), and so on.

The current concentration preventing pattern 280 is positioned between the first and second n-type clad layers 215 and 220. Also, the current concentration preventing pattern 280 is formed in a double layer structure. The double layer includes a silicon oxide (SiO) or silicon nitride (SiN) layer 280a formed on the first n-type clad layer 215, and a metal layer 280b stacked on the silicon oxide or silicon nitride layer 280a. The exposed part of the current concentration preventing pattern 280 is electrically connected to the n-type electrode 170 which is disposed on the exposed part of the second n-type clad layer 220.

Also, the current concentration preventing pattern 280 is formed in a mesh net shape. More specifically, the current concentration preventing pattern 280 is formed by primarily growing the silicon oxide (SiO) or silicon nitride (SiN) layer 280a on the first n-type clad layer 215 in the mesh net shape and then secondarily growing the metal layer 280b on the silicon oxide (SiO) or silicon nitride (SiN) layer 280a. The silicon oxide (SiO) or silicon nitride (SiN) layer 280a and the metal layer 280b are electrically connected to each other.

In order to manufacture the semiconductor light emission device of the second embodiment, the buffer layer 110 is formed on the sapphire substrate 100 before the first n-type clad layer 215 is epitaxially grown on the buffer layer 110. Afterward, the current concentration preventing pattern 280 is formed in the mesh net shape by primarily growing the silicon oxide (SiO) or silicon nitride (SiN) layer 280a on the entire surface of the first n-type clad layer 215, and then by growing the metal layer 280b on the Sio or SiN layer 280a. Continuously, the second n-type clad layer 220, the active layer 130, and the p-type clad layer 140 are sequentially formed on the entire surface of the first n-type clad layer 215 provided with the current concentration pattern 280, through an epitaxial growth process. Also, the transparent conductor layer 150 is formed on the p-type clad layer 140. The transparent conductor layer 150, p-type clad layer 140 and active layer 130 are partially removed to expose parts of second the n-type clad layer 220 and current concentration preventing pattern 280, by performing a mesa etching process. At the same time, a part of the second n-type clad layer 220 is etched by a fixed thickness, in order to expose a part of the current concentration preventing pattern 280. Finally, the p-type electrode 160 is formed on the transparent conductor layer 150, and the n-type electrode 170 is simultaneously formed on the exposed parts of the second n-type clad layer 220 and current concentration preventing pattern 280.

As described above, the semiconductor light emission device according to the second embodiment of the present disclosure allows the current concentration preventing pattern 280 electrically connected to the n-type electrode 170 to be formed on the sapphire substrate 100. As such, the current flow excessively concentrated to the exposed surfaces of the p-type clad layer 140, active layer 130, and second n-type clad layer 220 is uniformly dispersed over the entire area of the current concentration preventing pattern 280. Therefore, the semiconductor light emission device configured to use the sapphire substrate 100 can prevent the regionally excessive concentration of a current flow, and furthermore improve the reliability.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emission device comprising:
   a substrate;
   a current concentration preventing pattern formed in a mesh net shape on the substrate;
   an n-type clad layer formed on the substrate loaded with the current concentration preventing pattern;
   an active layer and a p-type clad layer sequentially formed on the n-type clad layer;
   an n-type electrode formed on a part of the n-type clad layer which is exposed by partially etching the p-type clad layer and active layer; and
   a p-type electrode formed on the p-type clad layer,
   wherein the current concentration preventing pattern is formed in a double layer structure which includes a first layer formed from one material of SiO and SiN and on the substrate, and a second layer formed from a metal material and on the first layer, and
   wherein a part of the current concentration preventing pattern comes in surface contact with the n-type electrode.

2. The semiconductor light emission device claimed as claim 1, wherein the substrate is configured to employ a sapphire substrate.

3. The semiconductor light emission device claimed as claim 1, wherein the current concentration preventing pattern is electrically connected to the n-type electrode.

4. The semiconductor light emission device claimed as claim 1, wherein the active layer is formed in a multi-quantum well structure and from one material of InGaN and GaN.

5. The semiconductor light emission device claimed as claim 1, further comprising a buffer layer formed between the substrate and the current concentration preventing pattern.

6. A semiconductor light emission device comprising:
   a substrate;
   a first n-type clad layer formed on the substrate;
   a current concentration preventing pattern formed in a mesh net shape and on the first n-type clad layer;
   a second n-type clad layer formed on the first n-type clad layer loaded with the current concentration preventing pattern;
   an active layer and a p-type clad layer sequentially formed on the second n-type clad layer;
   an n-type electrode formed on a part of the second n-type clad layer which is exposed by partially etching the p-type clad layer and active layer; and
   a p-type electrode formed on the p-type clad layer,
   wherein the current concentration preventing pattern is formed in a double layer structure which includes a first layer formed from one material of SiO and SiN and on the substrate, and a second layer formed from a metal material and on the first layer, and wherein a part of the current concentration preventing pattern comes in surface contact with the n-type electrode.

7. The semiconductor light emission device claimed as claim 6, wherein the substrate is configured to employ a sapphire substrate.

8. The semiconductor light emission device claimed as claim 6, wherein the current concentration preventing pattern is electrically connected to the n-type electrode.

9. The semiconductor light emission device claimed as claim 6, wherein the active layer is formed in a multi-quantum well structure and from one material of InGaN and GaN.

10. The semiconductor light emission device claimed as claim 6, further comprising a buffer layer formed between the first n-type clad layer and the first n-type clad layer.

* * * * *